United States Patent [19]

Hannon

[11] 4,085,454
[45] Apr. 18, 1978

[54] METHOD AND APPARATUS FOR THE CONTROLLED GENERATION OF WALL ENCODED MAGNETIC BUBBLE DOMAINS

[75] Inventor: David Malcolm Hannon, Palo Alto, Calif.

[73] Assignee: International Business Machines Corporation, Armonk, N.Y.

[21] Appl. No.: 783,378

[22] Filed: Mar. 31, 1977

[51] Int. Cl.$^2$ .............................................. G11C 19/08
[52] U.S. Cl. ........................................ 365/30; 365/19; 365/25
[58] Field of Search ................................. 340/174 TF

[56] References Cited
U.S. PATENT DOCUMENTS 4,001,794  1/1977  Voegeli ..................... 340/174 TF

OTHER PUBLICATIONS

"Bloch-line Information Writer for Magnetic Bubble Store"–Slonezewski; IBM Tec. Disc. Bul., vol. 18, #3 8/75.
"Bubble Propagation Technique for Improved Stability"–Beauliew; IBM Tec. Disc. Bul., vol. 1 9, #2, Jul. 1976.
"A New Type of Bubble Motion in Magnetic Garnet Films"–Nakanishi et al.; Japan J. Appl. Phys., vol. 13, (1974), No. 1.

Primary Examiner—Vincent P. Canney
Attorney, Agent, or Firm—Joseph E. Kieninger

[57] ABSTRACT

Two parallel conductors are positioned on top of a magnetic layer where bubble domains are to be coded. The two parallel conductors are positioned to form a gap therebetween of a particular size. An external in-plane magnetic field is applied to the magnetic layer. The size of the gap is selected such that when current is simultaneously applied in both conductors, a local in-plane field will be formed in the gap which is sufficient for coding bubble wall states and a vertical field will be formed in the gap sufficient to retain a bubble in the gap during the application of current to the conductors. The application of current in the one direction in the conductors codes a bubble with one pair (S = 0) of Bloch lines and the application of current in the opposite direction codes a bubble with no Bloch lines (S = 1).

8 Claims, 6 Drawing Figures

METHOD AND APPARATUS FOR THE CONTROLLED GENERATION OF WALL ENCODED MAGNETIC BUBBLE DOMAINS

FIELD OF THE INVENTION

This invention relates to bubble domains and more particularly to an apparatus and method for coding bubble wall states.

BRIEF DESCRIPTION OF THE PRIOR ART

In the prior art, T-I bar, T-X bar, C-bar, and contiguous disks information storage systems using single wall magnetic domains, data bits are represented by the presence or absence of bubble domains. With systems of this type it is not critical whether the bubble domains have zero, one, or two pair of Bloch lines. Domains can have different numbers of vertical Bloch lines which may roughly be thought of as a vertical line of twist in the wall magnetization. These Bloch lines separate two areas within the domain wall magnetization. These different domains have different directions of motion with respect to a vertical gradient magnetic field.

Bloch lines and their effect on the magnetic properties of bubble domains are described in U.S. Pat. No. 3,940,750 and 3,890,605 which are assigned to the assignee of the present invention. The use of bubbles having different numbers of Bloch lines is important in information systems employing a lattice array of bubble domain elements, such as that described in co-pending U.S. Patent Application Ser. No. 632,604 filed on Nov. 14, 1975, now U.S. Pat. No. 4,052,710, and assigned to the assignee of the present invention.

Methods to form bubble domains with a given number of Bloch lines therein are described in U.S. Pat. Nos. 4,001,794 and in 3,996,577. The method and apparatus described in U.S. Pat. No. 3,996,577 has been used with considerable success. This patent describes a magnetic layer which is exchange coupled to a bubble medium in an area where bubble domains are nucleated and is used together without or without an externally applied in-plane magnetic field to controllably generate bubble domains with either one pair ($S = 0$) or no Bloch lines ($S = 1$), respectively. The exchange coupled magnetic layer can be either an ion implanted layer, a thin garnet film with planar magnetization, or a thin permalloy film. This patent also describes the controlled switching of bubble domain wall states to either one of two known states by subjecting the wall of the bubble domain to a critical velocity, depending upon the application or not of the external in-plane magnetic field to the exhange coupled magnetic layer. This method employs a wide single conductor in a lattice device and in a preferred embodiment employs two levels of metallurgy. In addition, the vertical field is determined by the size of the local in-plane field that is selected. In this method, the $S = 1$ bubble moves in one direction under the conductor during the coding step. The $S = 0$ bubble, on the other hand, moves in the opposite direction under the conductor. As a result, the position of the bubble after it is coded depends on its state. The position of the bubble is further influenced by variations in the material, the stress of the conductors, and other parameters. This variation in bubble position after coding makes it difficult to propagate the bubbles.

It is the primary object of this invention to provide an improved method and apparatus for coding bubble wall states.

It is another object of this invention to provide a means for coding bubble wall states which utilizes one level of metallurgy.

It is still another object of this invention to provide a means for coding bubble wall states that requires a smaller area.

It is yet still another object of this invention to provide a means for coding bubble wall states in which the vertical field is substantially independent of the local inplane field.

It is a further object of this invention to provide means for controlling the position of the bubble during the coding step.

It is a still further object of this invention to provide means for increasing the data rate in a bubble lattice device.

These and other objects are accomplished by an apparatus and method employing two parallel conductors positioned on a film of magnetic material capable of supporting domains. The gap between the two parallel conductors is of such a size as to provide a local in-plane field which is sufficient for coding bubble wall states, as well as a vertical field which is sufficient to retain a bubble in the gap while current is applied in the conductors. An external in-plane magnetic field is applied to the bubble film. A bubble is coded with an $S = 1$ wall state when current is simultaneously applied in the two conductors in the same first direction. An $S = 0$ bubble is coded when the current is applied simultaneously in both conductors in a direction opposite to the first direction.

Other objects of this invention will be apparent from the following detailed description, reference being made to the accompanying drawings wherein various embodiments of the apparatus are shown.

BRIEF DESCRIPTION OF THE DRAWINGS

FIG. 2A illustrates the local in-plane and vertical fields for the apparatus of FIG. 2.

Description of the Illustrative Embodiment

A prior art coding apparatus of the type described in U.S. Pat. No. 3,996,577 has a bubble medium 10 which includes an exchange coupled magnetic layer (not shown) at the upper surface thereof. A single conductor 12 is positioned on top of the bubble medium 10. The conductor 12 is relatively wide, for example, typically the preferred width is of the order of 50 microns for 5 micron bubble devices. The bubble 14 to be coded is positioned in the bubble medium 10 under and near the center of conductor 12.

Figure 1A:
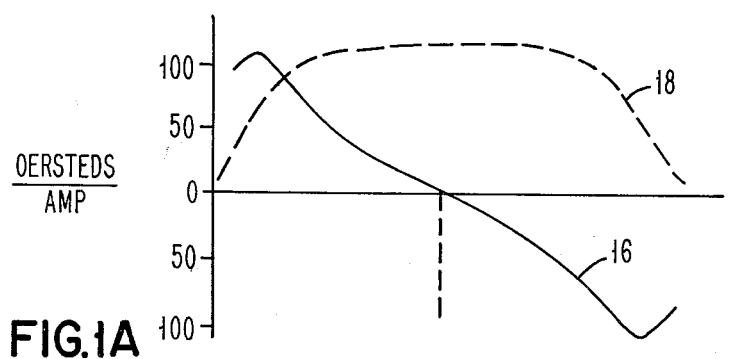
FIG. 1A illustrates the local in-plane and vertical fields for the prior art device of FIG. 1.
Figure 1:
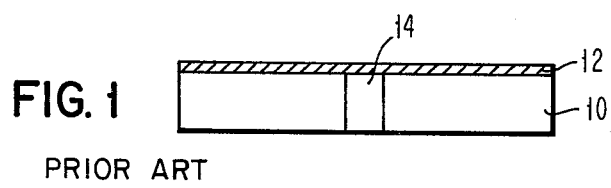
FIG. 1 is a cross-sectional view of a prior art coding apparatus.

A second level of metallurgy, not shown in FIG. 1, is required to move the bubble to the center of conductor 12 prior to coding and subsequently to move the coded bubble to the lattice.

FIG. 1A illustrates the relationship between the vertical field, $H_Z$, 16 and the local in-plane field, $H_P$, 18 that are formed under the conductor when a current is applied to the conductor 12.

The operation of the device in FIG. 1 involves the application of an external in-plane field, for example, 50 $O_e$, and the application of 0.5 amps in the conductor 12 resulting in approximately 50 $O_e$ local in-plane field, $H_P$, 18 at the bubble coding position. The gradient of the vertical field, $H_Z$, 18 causes the bubble to move to the right to a lower $H_Z$ value. If the current is left on too long in conductor 12, the bubble moves to a low $H_Z$ value and may stripe out. With this prior art device, the local in-plane field generated from the current subtracts to give ~ 0 $O_e$ and thus an S = 1 bubble having no Bloch lines is formed. An S = 0 bubble having one pair of Bloch lines is formed when the local in-plane field generated from the current adds to give ~ 100 $O_e$. The S = 1 state is formed in the absence of or at a very low in-plane magnetic field while an S = 0 bubble is formed in the presence of a substantial in-plane magnetic field.

After being coded, a bubble must be moved a distance away from the wide conductor so that the subsequent coding field does not collapse or stripe out the bubble. For the case of FIG. 1, a 5 micron bubble must move between 50 microns and 75 microns in order to be unaffected by the subsequent coding pulse used for the next bubble.

Since bubble motion has a limiting velocity, this distance determines the data rate. For example, if 15 meters/sec. is the limiting velocity, then the time required to move to the next position would be ~ 5$\mu$ Sec. (200 KHz) data rate.

Figure 2A:
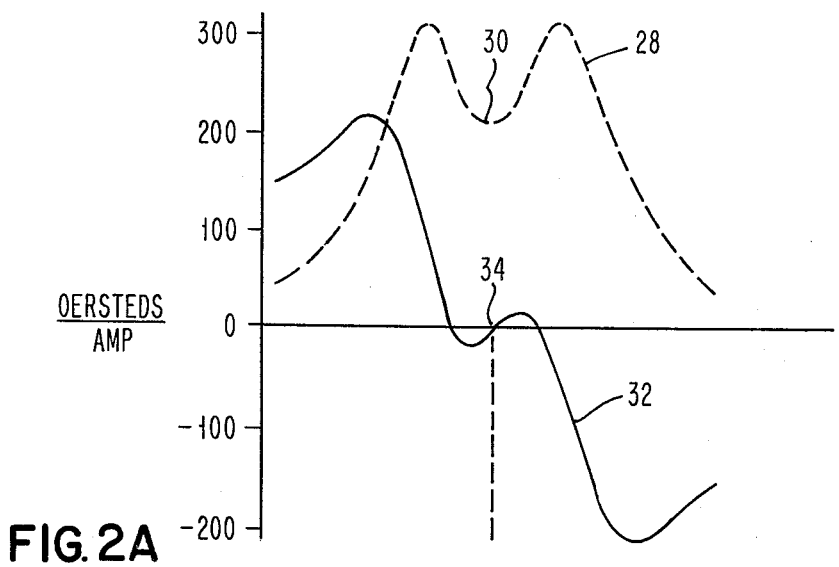
FIG. 2A is a cross-sectional view of the apparatus of this invention.
Figure 2:
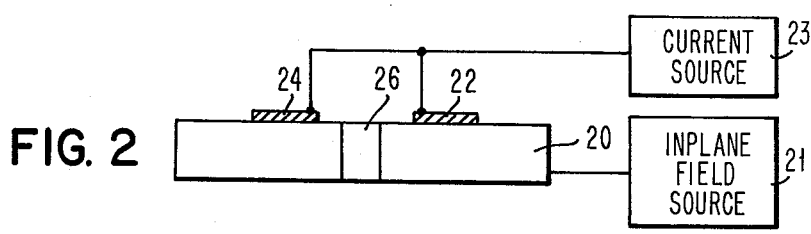

In accordance with this invention, as shown in FIG. 2, the apparatus for coding bubble wall states has a bubble medium 20 and a pair of conductors 22 and 24 positioned thereon. The bubble medium 20 is the same as the prior art bubble medium described in FIG. 1 and includes an exchange coupled magnetic layer (not shown). Conductors 22 and 24 are relatively narrow, for example, of the order of 4 microns.

In general, the width of the conductors is 1 to 4 times the bubble diameter. Typically, the width of the conductors for 2.5 micron to 5 micron bubbles is 2 to 20 microns wide with a preferred width being 3 to 5 microns. The particular conductor widths selected depend primarily on the application and represents the result of various design parameter tradeoffs. Narrow conductor widths require less area or chip real estate and thereby provide higher data rates. On the other hand, wider conductor widths require lower current densities and thereby provide improved conductor stability.

The gap between the conductors 22 and 24 is relatively narrow, for example, of the order of 6 microns. In general, the width of the gap is 0.5 to 2 times the bubble diameter. The gap formed between conductors having a width of 4 microns and used with 5 micron bubbles is 3 to 10 microns with the preferred width being 5 to 7 microns. The size of the gap between the conductors 22 and 24 is critical since the size of the gap must be such as to provide, when current from source 23 is passed through conductors 22 and 24 in the same direction, that a local in-plane field 28 is formed which is sufficient for coding the bubble wall states as well as a vertical field 32 as are shown in FIG. 2A. An external in-plane field of, typically, 20 to 60 $O_e$ is supplied from means 21.

The local in-plane field 28 has a dip 30 therein which is located directly over the gap between conductors 22 and 24. The vertical field 32 has a local well 34 therein which is also located near the center of the gap between the conductors 22 and 24. When current is applied to conductors 22 and 24, the bubble remains near the center of the conductors 22 and 24 because the local well 34 traps the bubble.

The size of the gap determines, when current is applied, the effectiveness of the local well 34 in the vertical field 32 in holding the bubble and keeping the bubble from moving to the lowest value of the vertical field 38. If the gap is too narrow, the local well 34 will be too shallow to hold the bubble and the bubble will go to vertical field 38 where it may stripe out. If the gap is too wide, the dip in the in-plane field 30 will be so deep as to require excessive current to code a bubble.

For example, to illustrate FIG. 2 and 2A, with an external in-plane field of 50 $O_e$, a current of 0.25 amps is passed through both conductors 22 and 24 in the same direction. The size of the conductors 22 and 24 in a preferred embodiment is 4 microns. These conductors are spaced apart to form a gap that is 6 microns wide. The combination of two conductors 4 microns wide separated by a gap 6 microns wide provides a local in-plane field in the gap which is sufficient for coding wall states and a vertical field in the gap which is sufficient to retain the bubble in the center of the conductors during the coding step. When the current is passed in one direction through the conductors, an S = 1 bubble is formed. When the current is passed through the opposite direction, and S = 0 bubble is formed.

Figure 3A:
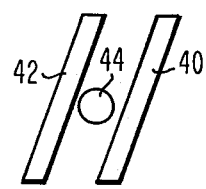
FIG. 3A is a top view of one conductor arrangement.

FIG. 3A illustrates one embodiment of the two conductors 40 and 42 with a bubble 44 in the gap therebetween as shown. In this embodiment, the coding conductors 40 and 42 may be on the same level as the conductors (not shown) used to translate the bubbles to provide a single level metallurgy system. The coding conductors 40 and 42 may also be used to translate bubbles before and after coding by applying the appropriate currents.

The embodiment shown in FIG. 3A has a relatively high data rate compared to the prior art device because after a bubble has been coded, it must be moved only 10 to 15 microns away from the coding position to be substantially unaffected by the next coding pulse. For example, if 15 meters/sec. is the limiting bubble velocity, the time required to move the bubble to its next position 10 to 15 microns away is 1$\mu$ sec. (1MHZ data rate).

Figure 3B:
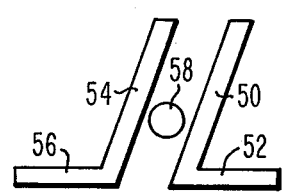
FIG. 3B is a top view of a second conductor arrangement.

A preferred embodiment is shown in FIG. 3B in which two parallel conductors 50 and 54 having extensions 52 and 56 respectively, directed away from the gap. The bubble 58 to be coded is located in the gap as shown. This embodiment requires a second level of metallurgy to translate the bubbles. One of the advantages of this embodiment is that after a bubble has been coded, it must be moved only about 7 microns away from the coding position to be substantially unaffected by the next coding pulse. As a result, the data rate is higher and the area required for the device is smaller.

A further application is to apply current to one conductor a short time before the current is applied to the second conductor. Applying a staggered current pulse in this manner imparts a controlled motion to the bubble during coding which reduced the coding error rate.

If desired, the conductors 40 and 42 in FIG. 3A and conductors 50 and 54 in FIG. 3B may also be connected at either or both ends. In this case, the staggered current pulse technique would not be used.

The wall state coding method and apparatus in accordance with this invention have a number of advantages. The twoconductor structure permits the vertical field in the gradient to be controlled within wide limits independent of the in-plane field. As a result, the motion of the bubble can be controlled during switching, whereas with the single conductor design, the velocity of the bubble during switching could become excessive leading to bubble wall state instability. This invention also permits the write functions of generation, switching and translation to be accomplished with a single level of metallurgy, if desired. One level metallurgy is important if conductors are used to supply the local bias needed to stabilize isolated bubbles. Other advantages include the increased data rate and the reduced area or real estate requirements.

Although several preferred embodiments of this invention have been described, it is understood that numerous variations may be made in accordance with the principles of this invention.

I claim:

1. An apparatus for coding bubble wall states in a bubble medium comprising
    a first conductor positioned on said bubble medium,
    a second conductor positioned parallel to said first conductor to form a gap there-between, said gap being of sufficient size to provide a local in-plane field in said gap sufficient for coding bubble wall states and a local vertical field in said gap sufficient to retain a bubble in said gap during the application of current in said first and second conductors, the widthh of said gap being approximately 0.5 to 2 times the bubble diameter,
    means for applying an external in-plane field to said bubble medium, and
    means for applying current simultaneously in the same direction in said first and second conductors to provide a local in-plane field and a local vertical field in said gap wherein the application of current in said conductors in a first direction codes a bubble with a first wall state and the application of current in said conductors in a direction opposite to said first direction codes a bubble with a second wall state.

2. An apparatus as described in claim 1 wherein the width of said conductors is 2 to 20 microns.

3. An apparatus as described in claim 1 wherein the width of said conductors is 1 to 4 times the diameter of the bubble that is coded.

4. An apparatus as described in claim 1 wherein said first and second conductors are spaced so as to form a gap having a width of 3 to 10 microns.

5. An apparatus as described in claim 1 wherein said first conductor and said second conductor are connected at least at one end.

6. An apparatus as described in claim 1 wherein said second conductor has a first portion parallel to said first conductor and a second portion traverse to said first portion.

7. A method of coding bubble wall states in a bubble medium in an apparatus having two parallel conductors adapted to form a gap there-between the wiidth of said gap being approximately 0.5 to 2 times the bubble diameter which provides a local in-plane field in said gap sufficient for coding bubble wall states and a local vertical field in said gap sufficient to retain a bubble in said gap during the application of current in said conductors comprising the steps of
    applying an external in-plane magnetic field to said bubble medium, and
    applying current simultaneously in said conductors in the same direction whereby the application of current in a first direction codes a bubble with a first wall state and the application of current in a direction to said first direction codes a bubble with a second wall state.

8. A method of coding bubble wall states in a bubble medium in an apparatus having a first conductor and a second conductor adapted to form a gap there-between the width of said gap being approximately 0.5 to 2 times the bubble diameter, which provides a local in-plane field in said gap sufficient for coding bubble wall states and a local vertical field in said gap sufficient to retain a bubble in said gap during the application of current in said conductors comprising the steps of
    applying an external in-plane magnetic field to said bubble medium,
    applying a current pulse in a first direction in said first conductor sufficient to impart a controlled motion to the bubble, and
    applying a current pulse in said second conductor in said first direction while said current pulse is being applied to said first conductor whereby the application of said current pulses in said first direction codes a bubble with a first wall state and the application of said current pulses in a like manner in a direction opposite to said first direction codes a bubble with a second state.

* * * * *